(12) United States Patent
Song et al.

(10) Patent No.: US 9,548,734 B1
(45) Date of Patent: Jan. 17, 2017

(54) SMART IMPEDANCE MATCHING FOR HIGH-SPEED I/O

(71) Applicants: Hongjiang Song, Mesa, AZ (US); Yan W. Song, Katy, TX (US); Zhiguo Qian, Chandler, AZ (US); Zhichao Zhang, Chandler, AZ (US)

(72) Inventors: Hongjiang Song, Mesa, AZ (US); Yan W. Song, Katy, TX (US); Zhiguo Qian, Chandler, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,090

(22) Filed: Dec. 26, 2015

(51) Int. Cl.
*H03K 19/00* (2006.01)
*H03K 19/0175* (2006.01)

(52) U.S. Cl.
CPC .. *H03K 19/0005* (2013.01); *H03K 19/017545* (2013.01)

(58) Field of Classification Search
CPC .................. H03K 19/0005; H04L 25/0278
USPC ........................................................... 326/30
See application file for complete search history.

(56) References Cited

U.S. PATENT DOCUMENTS

| | | | | |
|---|---|---|---|---|
| 5,134,311 A | * | 7/1992 | Biber | H03K 19/0005 326/30 |
| 6,380,758 B1 | * | 4/2002 | Hsu | H03K 19/00384 326/30 |
| 6,448,811 B1 | * | 9/2002 | Narendra | H03K 19/0005 326/27 |
| 2001/0045843 A1 | * | 11/2001 | Hernandez-Marti | H03H 11/30 326/30 |
| 2003/0001611 A1 | * | 1/2003 | Dour | H03K 19/0005 326/30 |
| 2003/0062920 A1 | * | 4/2003 | Radhakrishnan | H03K 19/0005 326/30 |
| 2007/0188187 A1 | * | 8/2007 | Oliva | H04L 25/0278 326/30 |
| 2010/0029226 A1 | * | 2/2010 | Visser | H03F 1/0205 455/115.1 |

* cited by examiner

*Primary Examiner* — Don Le
(74) *Attorney, Agent, or Firm* — Blakely, Sokoloff, Taylor & Zafman LLP

(57) ABSTRACT

Embodiments are generally directed to smart impedance matching for high-speed I/O. In some embodiments, a circuit includes an impedance sensing block; a finite state machine to provide impedance tuning for a driver; and a control block, the control block to provide a feedback loop to check and tune impedance of the driver. The impedance sensing block is to sample an output voltage of the driver to determine whether the impedance of the driver is greater than or less than an impedance of the channel; and the finite state machine is to produce a signal to decrease or increase the impedance of the driver based on the determination whether the impedance of the driver is greater than or less than the impedance of the channel.

21 Claims, 4 Drawing Sheets

SMART IMPEDANCE MATCHING FOR HIGH-SPEED I/O

TECHNICAL FIELD

Embodiments described herein generally relate to the field of electronic devices and, more particularly, to smart impedance matching for high-speed I/O.

BACKGROUND

In high speed IO signaling, the matching of impedances between a driver and channel is critical for effective operation. Mismatch of impedance results in a signal reflection, while proper impedance matching minimizes this signal reflection.

In conventional operation, a system commonly employs a dedicated impedance control circuit, also known as an R-Comp, to calibrate the driver impedance to a design value. The R-Comp employs an external high precision resistor on board to tune an on-chip resistor. The tuned on-chip resistor may then be replicated to all data-lanes.

While the R-Comp will allow for impedance tuning, this technique has several limitations. The R-Comp is an added cost to the package and platform because an extra package pin and a high precision resistor are required for each I/O family that is to be matched, where there are commonly 5 to 10 I/O families for a typical SOC (System on Chip) product. A replica of the R-comp impedance to data lanes may introduce a large error due to the significant silicon variation, especially for the cutting edge silicon process. If the impedance replica fails, a system may be forced to resort to per-lane R-comp, which is cost prohibitive.

Further, the driver impedance is only matched by the R-Comp to a particular design value, which is typically equal to the nominal channel impedance. However, in a real world channel there are manufacturing variations (commonly about 15%) that affect channel impedance. In addition, there are impedance discontinuities that will further affect the channel impedance. The R-Comp concept cannot effectively account for these types of non-idealities.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to smart impedance matching for high-speed I/O.

In some embodiments, an apparatus, system, or method provides for smart impedance matching, wherein an apparatus is to dynamically match a driver impedance to a channel impedance.

When a driver transmits a lone rising edge signal onto a channel, the voltage at the driver output already contains the impedance relationship between the driver and the channel. Such operation is related to the practice of a time-domain reflectometry (TDR) in which, for example, an impedance of a discontinuity can be determined from the amplitude of a reflected signal.

In some embodiments, a driver mechanism is to sense an impedance mismatch status from the driver output voltage, thus before a receiver reflection returns, and feedback this voltage to tune the driver impedance.

In a real-world channel, there are always certain impedance discontinuities, and these impedance discontinuities vary over channel locations and flight time. In some embodiments, an apparatus, system, or process performs a voltage sensing at multiple time points or over one or more time durations in order to smartly tune the driver impedance and thus minimize the overall signal reflections.

In some embodiments, an apparatus, system, or process providing smart impedance matching may provide advantages in performance and cost in comparison with conventional processes. Among other factors:

(1) Smart impedance match may allow for elimination of the conventional R-Comp pin and the external precision resistor, which thus allows for reduction in cost. The elimination of the R-Comp pin may allow for reducing 5 to 10 pins for a typical SOC package.

(2) Smart impedance matching avoids the error of impedance replica, instead providing for directly matching the impedance of each individual driver to its current attached channel. In this manner, smart impedance matching may automatically takes into account manufacturing variations. In operation, this allows more accurate impedance matching, reducing the common matching error of more than +/−10 Ohms to a value of, for example, less than +/−5 Ohms.

(3) Smart impedance matching operation takes into account impedance discontinuities in a real-world channel.

Figure 1:
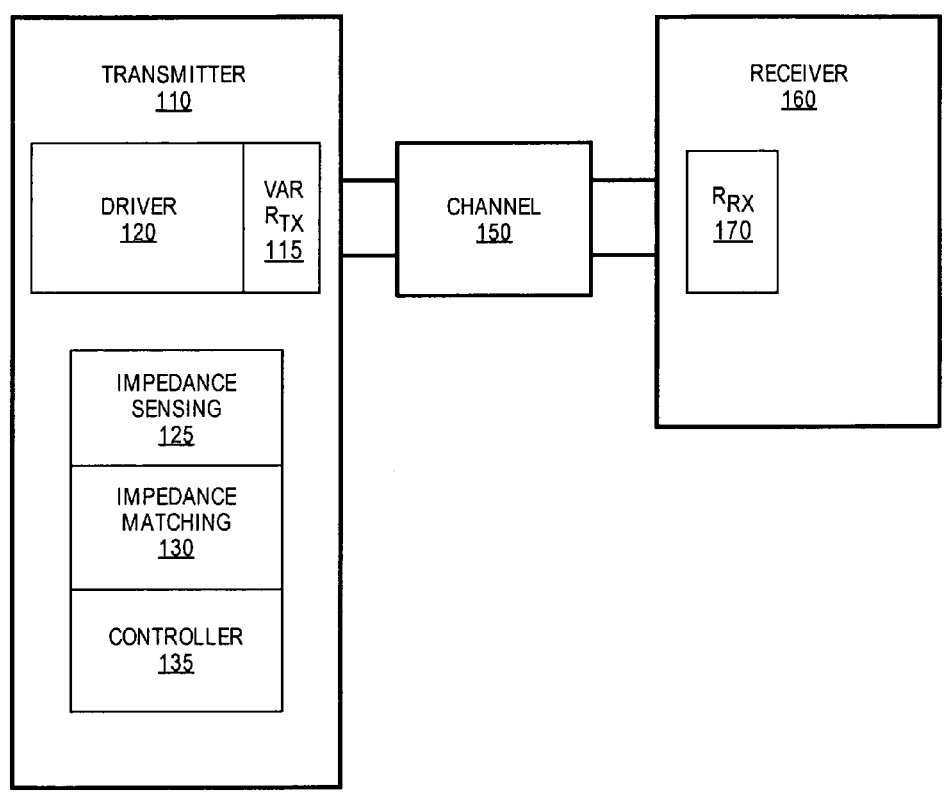
FIG. 1 is an illustration of smart impedance matching according to an embodiment.

FIG. 1 is an illustration of smart impedance matching according to an embodiment. In some embodiments, a transmitter 110 includes a driver 120 to drive a signal onto a channel 150 for transmission to a receiver 160. The transmitter may include certain resistance value 115 and the receiver may include certain resistance values 170 for matching the channel impedance.

In some embodiments, the transmitter 110 includes a first circuit or logic 125 to provide for impedance sensing for the channel 150. In some embodiments, the impedance sensing operation is based at least in part on a sample of a voltage of the driver 120 in driving a signal on the channel 150. In some embodiments, a multi-point impedance sensing is used to better optimize the driver impedance to minimize reflections. In some embodiments, the impedance sensing may compare a sensed voltage with a reference voltage to determine whether the driver impedance is greater or less than the channel impedance.

In some embodiments, the transmitter includes an impedance matching circuit or logic 130 to adjust impedance of driver based at least in part on voltage comparison by the impedance sensing logic or circuit 125. In some embodiments, the impedance matching 130 may operate to provide a signal to increase or decrease a variable transmitter resistance 115 to adjust the impedance matching. In some embodiments, the process of impedance sensing and impedance matching may continue until a certain impedance matching threshold is met.

In some embodiments, a transmitter is to include a controller 135 to provide control of the impedance sensing 125 and the impedance matching 130. In some embodiments, the controller is to provide timing control for the sampling of the driver output by the impedance sensing 125.

Figure 2:
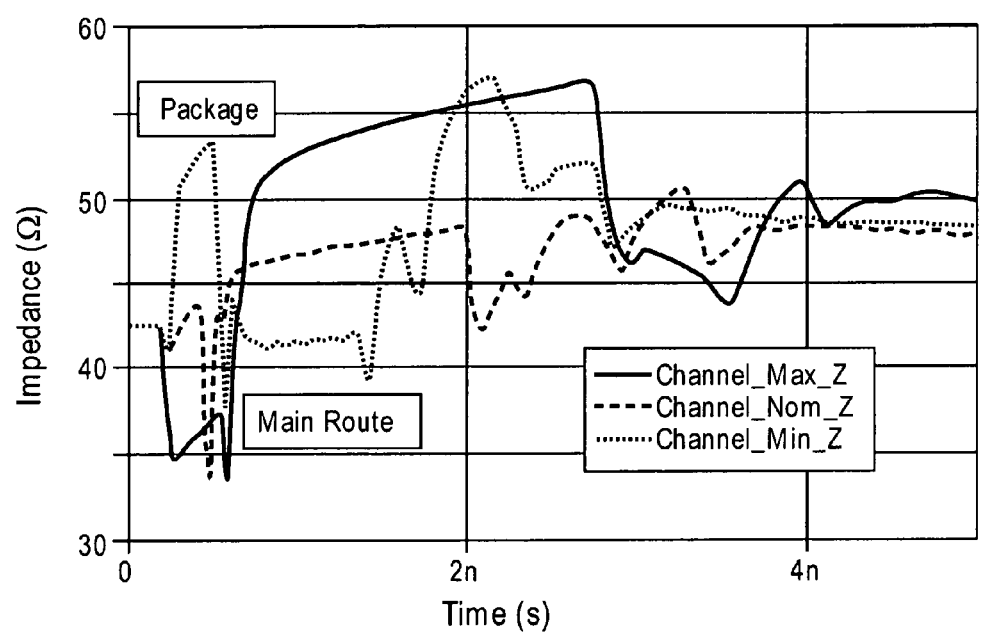
FIG. 2 is an illustration of impedance of a channel for application of smart impedance matching according to an embodiment.

FIG. 2 is an illustration of impedance of a channel for application of smart impedance matching according to an embodiment. FIG. 2 provides a particular impedance profile of a real world channel, which includes a package, a motherboard, and a connector. Each of these components has its own impedance corners due to the manufacturing variations. In addition, the signal routing also has length variations due to layout difference between data lanes.

The three representative curves presented in FIG. 2 demonstrate the significant differences in the channel impedance at different package and board impedance corners as well as different routing lengths. In the example provided in FIG. 2, the relatively flat region around 1 nanosecond corresponds to the main routing portion of the motherboard with a designed impedance around 45 Ohms.

In this particular example, if a conventional R-comp technique is used to control the driver impedance to the designed impedance value of 45 Ohms, the mismatch to the low or high impedance corner will be approximately 13%. Using the low impedance channel as an example, a 13% mismatch will immediately cause the signal to lose a 35 mV (millivolts) voltage margin in the channel with a 1 V voltage supply.

As shown in FIG. 2, the maximum channel impedance, nominal channel impedance, and minimum channel impedance may include significant variances. For an ideal transmission line, impedance matching may be achieved if the voltage change caused by a lone rising edge is half of the voltage supply. This value may be checked at any single time point shortly after the rising edge. However, because the real-world channel provided in FIG. 2 has complicated impedance, the single-point information is not sufficient to determine if sufficient impedance matching is met.

In some embodiments, multi-point sampling is applied in impedance sensing. In some embodiments, multi-point sampling may include sensing a voltage waveform at multiple points in time or for one or more designated time durations. In some embodiments, the multi-point voltage information may be processed through, for example, averaging or weighted averaging to allow the sampled value to be compared to a reference voltage, wherein the reference voltage may be, for example, half the driver voltage swing.

In some embodiments, based on the comparison between the sampled output voltage and a reference voltage value, a signal to increase or decrease impedance, such as up or down signal may be sent to an finite state machine or other logic to tune the driver impedance. The updated impedance will immediately affect the voltage waveform at the driver output. In some embodiments, the impedance sensing block may continue to check the voltage until a matching condition is met, such as a difference being within a particular threshold.

Figure 3:
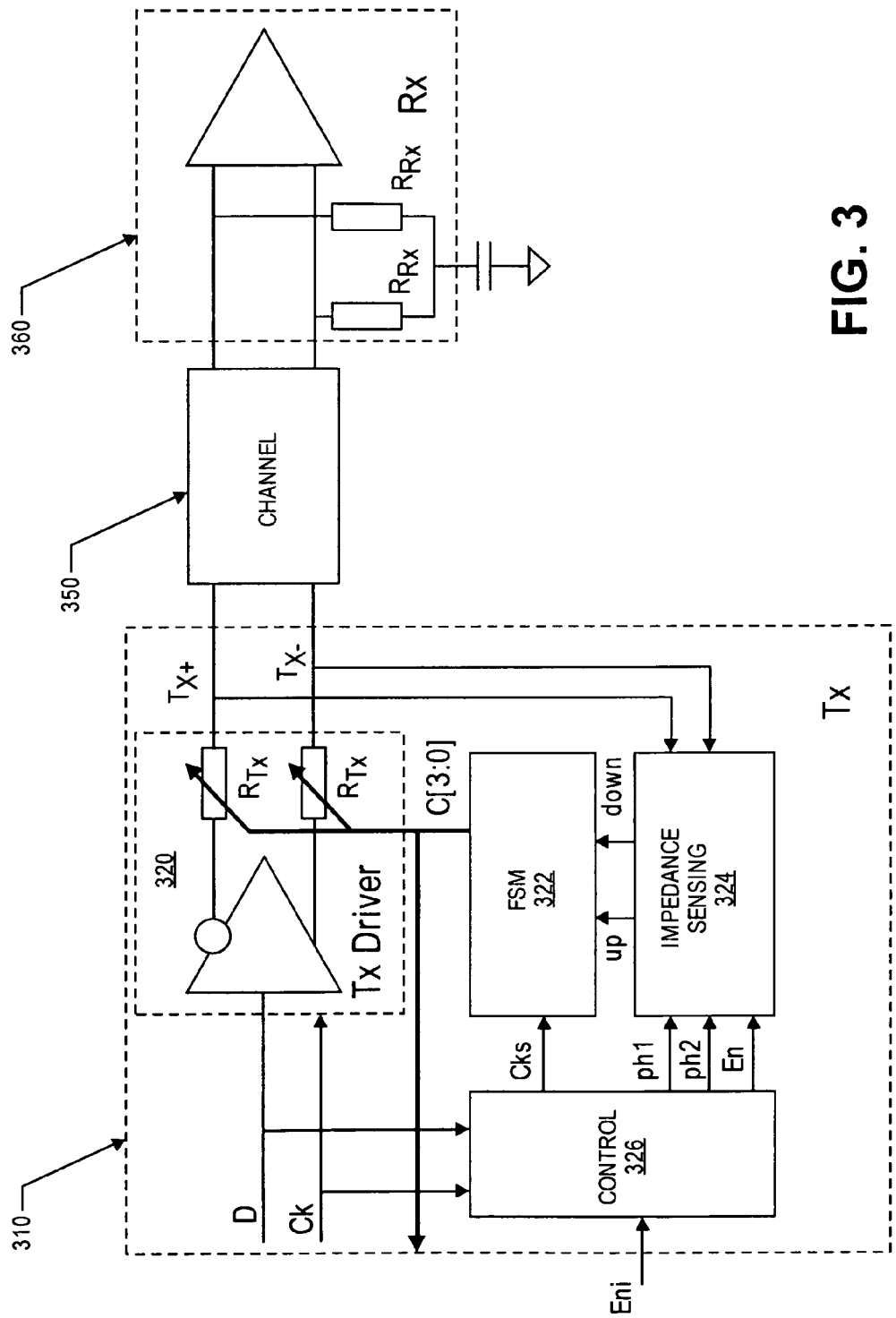
FIG. 3 is an illustration of a smart impedance matching circuit according to an embodiment.

FIG. 3 is an illustration of a smart impedance matching circuit according to an embodiment. In some embodiments, each driver of a circuit includes an impedance sensing block 324, an impedance tuning finite state machine (FSM) 322, and a control block to provide a feedback loop to check and tune the impedance of the driver.

In some embodiments, an impedance sensing block 324 samples the driver output voltage waveform, wherein the driver output voltage waveform may include a waveform caused by a single rising edge of a signal. In some embodiments, a sampling time point may follow shortly after the rising edge transition to ensure that the sampled voltage does not include far-end reflections.

As illustrated, a transmitter 310 includes a driver 320 to drive a signal on the channel 350 for reception by a receiver 360. The impedance of the channel 350 may be subject to many disturbances that cause variation in the actual channel impedance.

In some embodiments, the driver 320 (or other component) includes variable resistors ($R_{Tx}$) to provide for impedance matching of the drive impedance to the impedance of the channel. In some embodiments, the resistance values are set by the impedance tuning finite state machine, FSM 322, of the transmitter 310, wherein FSM 322 is to provide a certain impedance signal value to establish an impedance of the variable resistors, which in this instance is a four-bit value of C[3:0]. In some embodiments, FSM 322 receives a UP or DOWN signal value from the impedance sensing block 324, the UP or DOWN signal to cause the FSM 322 to increase or decrease the current impedance signal.

In some embodiments, impedance sensing 324 is to sense a voltage across an output of the transmitter, thus a voltage between TX+ and TX−, and utilize this sampled value to determine matching between the driver impedance and the channel, the UP and DOWN signals indicate whether the driver impedance is below or above the channel impedance, and thus whether the driver impedance should be increased or decreased.

In some embodiments, FSM 322 requires a clock signal (Cks) for the finite state machine to work. In some embodiments, the Cks signal is received from a controller or control logic 326. In some embodiments, the controller 326 provides signals for control of the impedance sensing 324 to, for example, enable the timing of signal sample to a lone rising edge. In some embodiments, the control signals provided from the controller 326 include enable signal (En), and phase signals (ph1 and ph2). In some embodiments, the controller 326 senses the data (D) and clock (Ck) input to the driver 310, the controller to determine the sampling of the driver output signal based on such signals.

Figure 4:
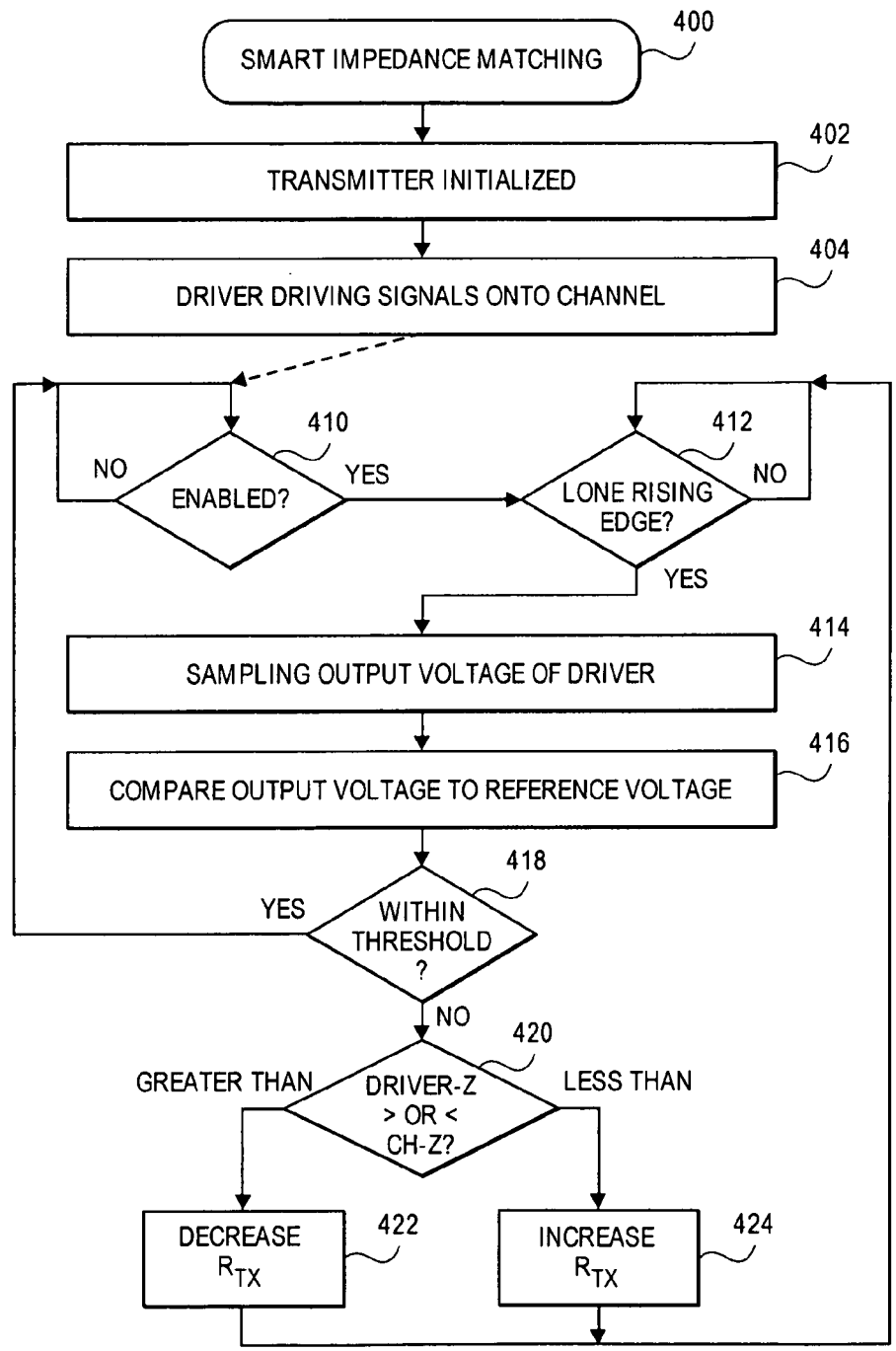
FIG. 4 is a flowchart to illustrate a process for smart impedance matching according to an embodiment.

FIG. 4 is a flowchart to illustrate a process for smart impedance matching according to an embodiment. In some embodiments, in a process for smart impedance matching 400, a transmitter may be initialized 402 and operate to drive signals onto a channel 404.

In some embodiments, if a smart impedance process is enabled 410, (wherein the impedance matching may, for example, be enabled to occur at certain time intervals) there may be a determination that a signal driven by driver onto the channel is a lone rising edge 412, and thus is not currently subject to signal reflection interference. In some embodiments, if a lone rising edge is present 412, then the process proceeds with sampling an output voltage of the driver 414. In some embodiments, the sample is taken a short time after the rising transition of the signal to minimize the risk of signal reflection. In some embodiments, the sampling includes a multi-point sampling at multiple points in time or over one or more durations of time.

In some embodiments, the sampled output voltage is compared to a certain reference 416, wherein the reference voltage may be, for example, one-half of the signal voltage swing. In some embodiments, if the sampled voltage is within a certain threshold of the reference voltage 418, thus indicating that a sufficient impedance match has been achieved, the process may return to the enablement determination for the process 410.

In some embodiments, if the comparison between the sampled voltage and the reference voltage is not within the certain threshold 418, then the process may continue with adjustment of the driver impedance. If the comparison between the driver output voltage and the reference voltage indicates that the driver impedance is greater than the channel impedance 420, then a control signal is provided to decrease the value of variable transmitter resistance $R_{Tx}$ 422. If the comparison indicates that the transmitter impedance is less than the channel impedance 420, then a control signal is provided to increase the value of variable transmitter resistance $R_{Tx}$ 424.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a circuit includes an impedance sensing block; a finite state machine to provide impedance tuning for a driver; and a control block, the control block to provide a feedback loop to check and tune impedance of the driver. In some embodiments, the impedance sensing block is to sample an output voltage of the driver to determine whether the impedance of the driver is greater than or less than an impedance of the channel; and the finite state machine is to produce a signal to decrease or increase the impedance of the driver based on the determination whether the impedance of the driver is greater than or less than the impedance of the channel.

In some embodiments, the impedance sensing block is to compare the output voltage of the driver to a reference voltage.

In some embodiments, the reference voltage is half of a voltage swing value for the driver.

In some embodiments, the impedance sensing block is perform multi-point sampling of the output voltage of the driver at multiple points in time or during one or more time durations.

In some embodiments, the impedance sensing block is to process the multi-point sampled output voltage by averaging or weighted-averaging.

In some embodiments, the control block is to sense a data signal and a clock signal for the driver.

In some embodiments, the control block is further to provide a sampling signal based at least in part on the sensing of the data signal and the clock signal for the driver.

In some embodiments, a method includes sampling an output voltage of a driver driving a signal on a channel; comparing an impedance of the driver to an impedance of the channel based on the sampling of the output voltage of the driver; and providing a signal to adjust the impedance of the driver based on the comparison of the impedance of the driver to the impedance of the channel. In some embodiments, the signal to adjust impedance of the driver is either a signal to increase an impedance of the driver if the impedance of the driver is less than an impedance of the channel or a signal to decrease an impedance of the driver if the impedance of the driver is greater than an impedance of the channel.

In some embodiments, sampling an output voltage of a driver includes sampling a lone rising edge signal.

In some embodiments, comparing the impedance of the driver to the impedance of the channel includes comparing the output voltage of the driver to a reference voltage.

In some embodiments, the reference voltage is half of a voltage swing value of the driver.

In some embodiments, the method further includes continuing to compare the impedance of the driver to the impedance of the channel and to provide a signal to adjust impedance of the driver until the comparison of the output voltage of the driver to the reference voltage is within a threshold.

In some embodiments, sampling an output voltage of the driver includes multi-point sampling at multiple points in time or during one or more certain time durations.

In some embodiments, the method further includes processing the multi-point sampled output voltage by averaging or weighted-averaging.

In some embodiments, the method further includes sensing a data signal and a clock signal for the driver.

In some embodiments, the method further includes providing a sampling signal based at least in part on the sensing of the data signal and the clock signal for the driver.

In some embodiments, an apparatus includes a driver to drive a signal on a channel; a variable output resistance; an impedance sensing logic; and an impedance matching logic. In some embodiments, the impedance sensing logic is to sample an output voltage of the driver to compare an impedance of the driver to an impedance of the channel; and the impedance matching logic is to adjust the variable output resistance based on the comparison of the impedance of the driver to the impedance of the channel.

In some embodiments, the comparison of the impedance of the driver to the impedance of the channel includes the impedance sensing logic to compare the output voltage of the driver to a reference voltage.

In some embodiments, the sample of the output voltage of the driver includes a multi-point sampling at multiple points in time or during one or more certain time durations.

In some embodiments, the impedance sensing logic is to process the multi-point sampled output voltage by averaging or weighted-averaging.

In some embodiments, the apparatus further includes a controller, the controller to sense a data signal and a clock signal for the driver.

In some embodiments, the controller is to provide a sampling signal to the sensing logic based at least in part on the sensing of the data signal and the clock signal for the driver.

In some embodiments, a non-transitory computer-readable storage medium having stored thereon data representing sequences of instructions that, when executed by one or more processing units, cause the one or more processing units to perform operations including sampling an output voltage of a driver driving a signal on a channel; comparing an impedance of the driver to an impedance of the channel based on the sampling of the output voltage of the driver; and providing a signal to adjust the impedance of the driver based on the comparison of the impedance of the driver to the impedance of the channel. In some embodiments, the signal to adjust impedance of the driver is either a signal to increase an impedance of the driver if the impedance of the driver is less than an impedance of the channel or a signal to decrease an impedance of the driver if the impedance of the driver is greater than an impedance of the channel.

In some embodiments, an apparatus includes means for sampling an output voltage of a driver driving a signal on a channel; means for comparing an impedance of the driver to an impedance of the channel based on the sampling of the output voltage of the driver; and means for providing a signal to adjust the impedance of the driver based on the comparison of the impedance of the driver to the impedance of the channel. In some embodiments, the signal to adjust impedance of the driver is either a signal to increase an impedance of the driver if the impedance of the driver is less than an impedance of the channel or a signal to decrease an impedance of the driver if the impedance of the driver is greater than an impedance of the channel.

What is claimed is:

1. A circuit comprising:
  an impedance sensing block;
  a finite state machine to provide impedance tuning for a driver; and
  a control block, the control block to provide a feedback loop to check and tune impedance of the driver;
  wherein the impedance sensing block is to sample an output voltage of the driver to determine whether the impedance of the driver is greater than or less than an impedance of a channel, wherein sampling the output voltage of the driver includes the impedance sensing block to sample a lone rising edge signal; and
  wherein the finite state machine is to produce a signal to decrease or increase the impedance of the driver based on the determination whether the impedance of the driver is greater than or less than the impedance of the channel.

2. The circuit of claim 1, wherein the impedance sensing block is to compare the output voltage of the driver to a reference voltage.

3. The circuit of claim 2, wherein the reference voltage is half of a voltage swing value for the driver.

4. The circuit of claim 1, wherein the impedance sensing block is perform multi-point sampling of the output voltage of the driver at multiple points in time or during one or more time durations.

5. The circuit of claim 4, wherein the impedance sensing block is to process the multi-point sampled output voltage by averaging or weighted-averaging.

6. The circuit of claim 1, wherein the control block is to sense a data signal and a clock signal for the driver.

7. The circuit of claim 6, wherein the control block is further to provide a sampling signal based at least in part on the sensing of the data signal and the clock signal for the driver.

8. A method comprising:
  sampling an output voltage of a driver driving a signal on a channel, wherein sampling the output voltage of the driver includes sampling a lone rising edge signal;
  comparing an impedance of the driver to an impedance of the channel based on the sampling of the output voltage of the driver; and
  providing a signal to adjust the impedance of the driver based on the comparison of the impedance of the driver to the impedance of the channel;
  wherein the signal to adjust impedance of the driver is either a signal to increase an impedance of the driver if the impedance of the driver is less than an impedance of the channel or a signal to decrease an impedance of the driver if the impedance of the driver is greater than an impedance of the channel.

9. The method of claim 8, wherein comparing the impedance of the driver to the impedance of the channel includes comparing the output voltage of the driver to a reference voltage.

10. The method of claim 9, wherein the reference voltage is half of a voltage swing value of the driver.

11. The method of claim 9, further comprising continuing to compare the impedance of the driver to the impedance of the channel and to provide a signal to adjust impedance of the driver until the comparison of the output voltage of the driver to the reference voltage is within a threshold.

12. The method of claim 8, wherein sampling an output voltage of the driver includes multi-point sampling at multiple points in time or during one or more certain time durations.

13. The method of claim 12, further comprising processing the multi-point sampled output voltage by averaging or weighted-averaging.

14. The method of claim 8, further comprising sensing a data signal and a clock signal for the driver.

15. The method of claim 14, further comprising providing a sampling signal based at least in part on the sensing of the data signal and the clock signal for the driver.

16. An apparatus comprising:
a driver to drive a signal on a channel;
a variable output resistance;
an impedance sensing logic; and
an impedance matching logic;
wherein the impedance sensing logic is to sample an output voltage of the driver to compare an impedance of the driver to an impedance of the channel, wherein sampling the output voltage of the driver includes the impedance sensing block to sample a lone rising edge signal; and
wherein the impedance matching logic is to adjust the variable output resistance based on the comparison of the impedance of the driver to the impedance of the channel.

17. The apparatus of claim 16, wherein the comparison of the impedance of the driver to the impedance of the channel includes the impedance sensing logic to compare the output voltage of the driver to a reference voltage.

18. The apparatus of claim 16, wherein the sample of the output voltage of the driver includes a multi-point sampling at multiple points in time or during one or more certain time durations.

19. The apparatus of claim 18, wherein the impedance sensing logic is to process the multi-point sampled output voltage by averaging or weighted-averaging.

20. The apparatus of claim 16, further comprising a controller, the controller to sense a data signal and a clock signal for the driver.

21. The apparatus of claim 20, wherein the controller is to provide a sampling signal to the impedance sensing logic based at least in part on the sensing of the data signal and the clock signal for the driver.

* * * * *